United States Patent [19]
Wong et al.

[11] Patent Number: 5,896,340
[45] Date of Patent: Apr. 20, 1999

[54] MULTIPLE ARRAY ARCHITECTURE FOR ANALOG OR MULTI-BIT-CELL MEMORY

[75] Inventors: Sau C. Wong, Hillsborough; Hock C. So, Redwood City, both of Calif.

[73] Assignee: Invox Technology, Campbell, Calif.

[21] Appl. No.: 08/889,111

[22] Filed: Jul. 7, 1997

[51] Int. Cl.$^6$ .................................................. G11C 8/00
[52] U.S. Cl. .................. 365/230.03; 365/63; 365/230.06
[58] Field of Search ...................... 365/230.03, 230.06, 365/63

[56] References Cited

U.S. PATENT DOCUMENTS

| | | | |
|---|---|---|---|
| 5,428,568 | 6/1995 | Kobayashi et al. | 365/185 |
| 5,521,864 | 5/1996 | Kobayashi et al. | 365/185.22 |
| 5,646,886 | 7/1997 | Brahmbhatt | 365/185.16 |
| 5,706,243 | 1/1998 | Mori | 365/230.06 X |
| 5,708,620 | 1/1998 | Jeong | 365/230.06 |

*Primary Examiner*—Do Hyun Yoo
*Attorney, Agent, or Firm*—Skjerven, Morrill, MacPherson, Franklin & Friel; David T. Millers

[57] ABSTRACT

A memory architecture divides memory cells of a memory into multiple memory arrays where each memory array has local row and column lines that are directly coupled to memory cells in the memory array and electrically isolated from other arrays. Continuous global row and column lines cross the memory arrays. The memory additionally includes global decoders that apply operating voltages to the global lines corresponding to a selected memory cell being access. Local decoders decode bits from the address signal to select an array containing the selected memory cell and connect the global lines to the selected memory array. Other memory arrays are disconnected from the global lines to avoid disturbance that would result from the operating voltage being applied to unselected memory cells. Alternative, embodiments include a memory including a row of memory arrays, or a column of memory arrays, or multiple rows and multiple columns of memory arrays. Another alternative embodiment has continuous global column, row, and source lines and local source lines. Global decoding circuitry applies a source bias voltage to the global source lines which local source decoders apply to the local source lines for unselected sectors in the array containing the selected memory cell. The source bias voltage reduces threshold voltage disturbances caused by programming voltage being applied to row lines.

26 Claims, 7 Drawing Sheets

MULTIPLE ARRAY ARCHITECTURE FOR ANALOG OR MULTI-BIT-CELL MEMORY

BACKGROUND

1. Field of the Invention

This invention relates to non-volatile semiconductor memory capable of storing an analog value or multiple bits per memory cell.

2. Description of Related Art

A typical electrically erasable non-volatile memory contains a memory array including hundreds or thousands of rows of memory cells and hundreds or thousands of columns of memory cells, where each memory cell contains a transistor such as a floating gate or split-gate transistor having a programmable threshold voltage. The threshold voltage of a memory cell (or a transistor within the memory cell) indicates a stored value and is programmed by applying appropriate programming voltages to the control gate, source, and drain of the memory cell. Depending on the resolution of read and write circuits which read and write threshold voltages, non-volatile memory can store one bit, an analog value, or a multi-bit value per memory cell.

In a typical non-volatile memory architecture, each row of memory cells in a memory array has a row (or word) line coupled to control gates of the memory cells in the row, and each column of memory cells has a column (or bit) line coupled to drains of the memory cells in the column. Sources of the memory cells in an array may be connected in a variety of ways. For example, a virtual ground array often has neighboring columns of memory cells that share a column line so that each column line in a virtual ground array is coupled to the drains of memory cells in one column and to the sources of memory cells in the neighboring column. For flash memory, sources of all memory cells in an erasable sector are coupled to a source line for the sector. Accessing memory cells for erase, write, or read operations applies appropriate voltages to the row, column, and source lines coupled to the memory cell or cells to be erased, written, or read. When programming (or writing to) a selected memory cell, programming voltages applied to selected row, column, and source lines for a sufficient period change the threshold voltage of the memory cell coupled to those lines.

A problem in non-volatile memories is that voltages applied to row and column lines of memory cells selected for a write or erase operation can disturb or change the threshold voltages of memory cells in the same columns or rows as the selected memory cells. The accumulated threshold voltage disturbances from writing to hundreds or thousands of memory cells in the same row or column can significantly change the threshold voltage of a memory cell and the value stored in the memory cell. This problem is particularly significant for large memory arrays which have more memory cells per row and column. The problem is also significant in analog or multilevel memories where a relatively small variation in a threshold voltage changes the value stored. Accordingly, methods and architectures for reducing the write and erase disturb in analog and multilevel memories are sought.

SUMMARY

In accordance with the invention, a memory architecture partitions memory cells of a memory into multiple memory arrays where each memory array has local lines that are coupled to memory cells in the memory array and electrically isolated from local lines of other arrays. Continuous global row, column, and/or source lines cross the memory arrays. The memory additionally includes global decoders that decode an address signal and apply operating voltages to the global line or lines corresponding to the selected memory cell or cells being accessed. Local decoders select an array containing the selected memory cell and connect the global lines to the local lines of the memory array containing the selected memory cell while the local lines of other memory arrays are disconnected from the global lines to avoid disturbance that would result from the operating voltage being applied to the local lines (i.e., to memory cells.)

Embodiments of the invention include but are not limited to analog and multilevel memory which are particularly sensitive to disturbance of the threshold voltage. Dividing such memories into multiple arrays reduces the accumulated disturb by a factor about equal to the number of arrays. Separation of decoding circuitry into global and local decoders reduces the overhead when compared with a memory having multiple arrays where each array has self-sufficient decoders.

BRIEF DESCRIPTION OF THE DRAWINGS

Use of the same reference symbols in different figures indicates similar or identical items.

DETAILED DESCRIPTION OF THE PREFERRED EMBODIMENTS

In accordance with an aspect of the invention, an analog or multilevel memory includes multiple arrays of memory cells where each memory array has local row lines, local column lines, and/or local source lines coupled to local decoders. Local row, column, and source lines of the different arrays are electrically separated to reduce the number of memory cells in the same row or column as memory cells being program and reduce the number of threshold voltage disturbances. Accordingly, the multiple array architecture reduces the accumulated threshold voltage disturb when compared to a memory architecture having a single larger array. In accordance with a further aspect of the invention, the memory includes global decoders such as a global row decoder and/or a global column decoder with global row lines and/or global column lines for multiple arrays. The local column or row decoders connect the global column or row lines to the local column or row lines of a selected array containing a memory cell being programmed. The combination of global and local decoding reduces the complexity and the total decoding circuitry required for the memory.

Figure 1:
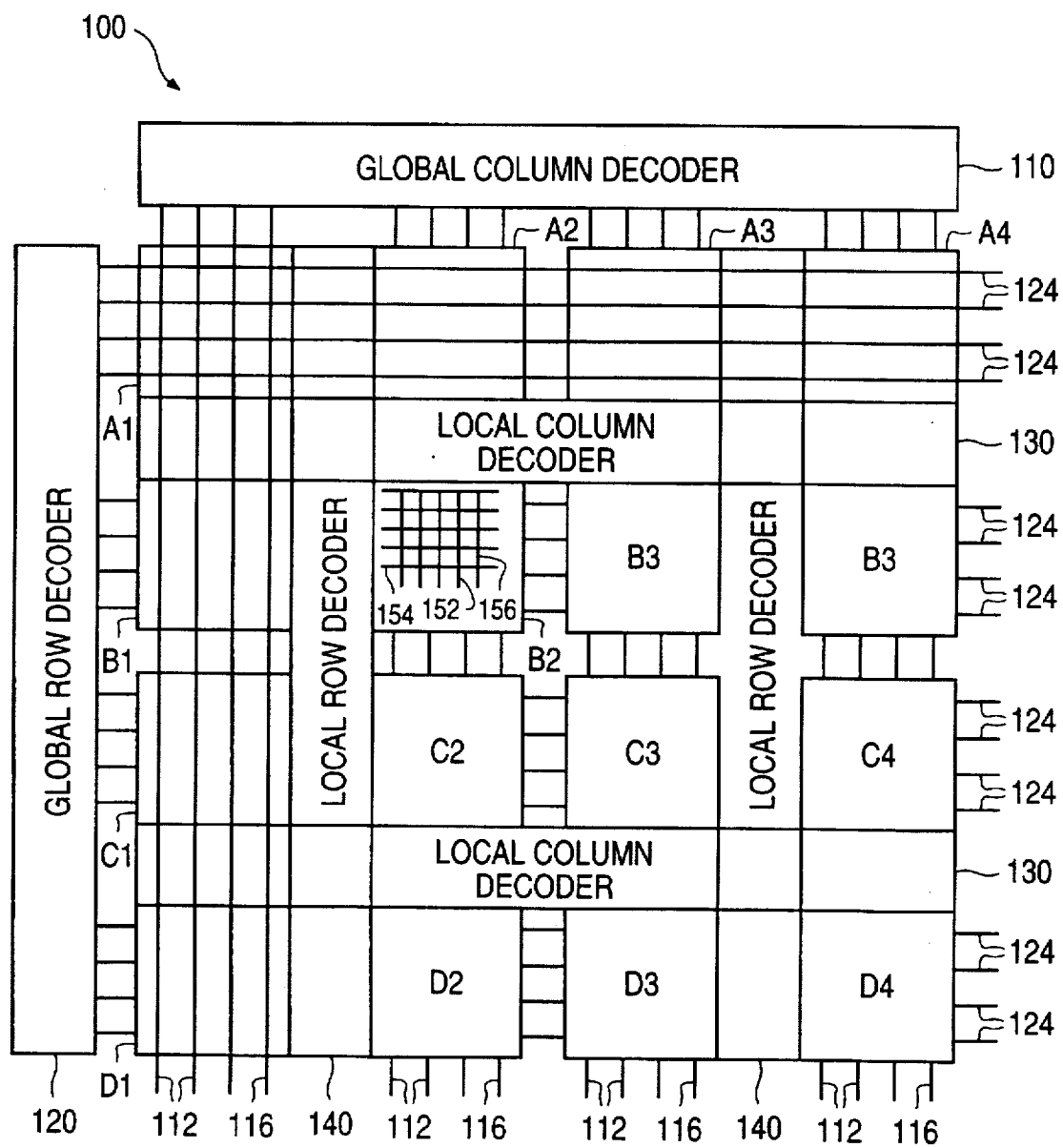
FIG. 1 shows a multiple array architecture in accordance with an embodiment of the invention where global decoders are at the perimeter of an array of memory arrays.

FIG. 1 shows a memory 100 in accordance with an embodiment of the invention. Memory 100 is an integrated circuit formed on a single semiconductor substrate including sixteen arrays A1 to D4 of memory cells which are arranged in four columns A1 ... D1, A2 ... D2, A3 ... D3, and A4 ... D4 of arrays and four rows A1 ... A4, B1 ... B4, C1 ... C4, and D1 ... D4 of arrays. Alternative memory architectures in accordance with the invention can include any integer number x of columns of arrays and any integer number y of rows of arrays where x or y is greater than 1. Memory 100 illustrates an example where x and y are equal to 4. Each of memory arrays A1 to D4 contains i columns and j rows of memory cells coupled to i local column lines 152 and j local row lines 154. For ease of illustration, FIG. 1 only shows local column lines 152 and local row lines 154 in array B2, but each of arrays A1 to D4 has similar local row and column lines. Each row or column of memory array 100 includes four electrically separated local rows or columns in four different arrays. In an exemplary embodiment, memory 100 is a flash memory, and each of arrays A1 to D4 has one or more local source lines 156, where each source line 156 corresponds to an independently erasable sector in the array. The local column, row, and source lines in each array are electrically isolated from the local column, row, and source lines of the other arrays.

Arrays A1 to D4 may be constructed using known memory array architectures. In the exemplary embodiment, each array of memory cells A1 to D4 is an array of n-channel floating gate transistors. Each n-channel floating gate transistor has source, drain, and channel regions disposed in a semiconductor substrate, a floating gate overlying the channel region, and a control gate overlying the floating gate. Insulating layers between the substrate and the floating gates and between the floating gates and the control gates isolate the floating gates from direct electrical contact, but channel hot electron injection or Fowler-Nordhiem tunneling through the insulating layers can charge or discharge the floating gate and change the threshold voltage of the memory cell during a program or erase operation. In the exemplary embodiment, drain and source regions are diffused in a silicon substrate. Floating gates are formed in a first polysilicon layer overlying the substrate. Local row lines 154, each of which forms the control gates of the floating gate transistors of a local row, are formed in a second polysilicon or silicide layer. Local column lines 152 and local source lines 156 are formed in a first metal layer and contact underlying diffused regions in the substrate. In particular, the source regions of the floating gate transistors in a sector of the exemplary memory array are portions of diffused local source lines (not shown) in the substrate, and each local source line 156 straps together the diffused local source lines for a sector. In the exemplary embodiment, each erasable sector contains multiple local columns of memory cells (i.e., is column based), and the diffused local source lines connect multiple memory cells from the same or adjacent rows. Alternative embodiments may have row-based sectors (each sector containing one or more local rows) and/or use other semiconductor memory structures.

Overlying arrays A1 to D4 are continuous global column lines 112, global row lines 124, and global source lines 116 which in the exemplary embodiment are formed from second and third metal layers. Global column, row, and source lines 112, 124, and 116 connect global decoders 110 and 120 to local decoders 130 and 140. Generally, memory 100 contains n global column lines 112 and m global row lines 114 where n is less than or equal to the number x*i of columns in memory 100 and m is less than or equal to the number y*j of rows in memory 100, x, y, i, and j being defined above. The exemplary embodiment has twices as many columns as global column lines (x*i=2n.) Local decoders 130 and 140 between arrays A1 to D4 select an array or arrays and connect global column, row, and source lines 112, 124, and 116 to selected local column, row, and source lines 152, 154, and 156 in the selected array or arrays.

To access a selected memory cell in one of arrays A1 to D4, column decoder 110 decodes bits from a column address signal to select a global column line 112 corresponding to a column of memory cells containing the selected memory cell. Drivers in global column decoder 110 apply voltages to the selected global column and source lines 112 and 116 as required for the access to the selected memory cell. Local column decoders 130 decode bits from a row address signal to select a row or bank of arrays A1 ... A4, B1 ... B4, C1 ... C4, or D1 ... D4 that contains the selected memory cell and connects global column lines 112 to local column lines 152 in the selected arrays. If, for example, the number n of global column lines 112 is equal to the total number (x*i) of columns in memory 100, global column lines 112 have a one-to-one correspondence with local column lines 152 in the selected row of arrays, and local column decoders 130 connect each global column lines 112 to the corresponding local column line in the selected row of arrays. If there are fewer global column lines 112 than local column lines 152 in a row of arrays, then at least some global column lines 112 correspond to more than one local column line 152 in the selected row of arrays; and for each global column line 112, local column decoders 130 select which of the local column lines corresponding to the global column line is connected to the global column line. Local decoders 130 decode bits of the column address to select from among multiple local column lines corresponding to a single global column line. Additionally, in the exemplary embodiment where erase sectors are column-based, global column decoder 110 controls voltages on global source lines 116 which are intermixed with global column lines 112, and local decoders 130 connect global source lines 116 to local source lines 156 in the selected row of arrays.

Global row decoder 120 decodes bits from the row address signal to select a global row line 124 that corresponds to the selected memory cell and applies to the selected global row line 124 a voltage required to access the selected memory cell. Local decoders 140 decode bits from the column address signal to select a column or bank of arrays A1 ... D1, A2 ... D2, A3 ... D3, or A4 ... D4 that contains the selected memory cell to be accessed and connects global row lines 124 to local row lines 154 in the selected column of arrays. For embodiments where global row lines 124 are in one-to-one correspondence with the local row lines 154 in a column of arrays (i.e., for m=y*j), local decoders 140 connect each local row line 154 in the selected column of arrays to its corresponding global word line 124. Alternatively, where each array A1 to D4 contains more than one local row line 154 that corresponds to the same global row line 124, local decoders 140 additionally decode bits from the row address to select which local row line is connected to the corresponding global row line.

Memory 100 reduces program disturb by only applying programming voltages to the one of arrays A1 to D4 that contains a selected memory cell being programmed. For example, channel hot electron injection programs an n-channel memory cell by charging the floating gate and increasing the threshold voltage of the memory cell. For channel hot electron injection, a relatively large voltage difference is created between the control gate and the source of a memory cell while the memory cell conducts a source-drain current. Programming voltages Vrp and Vcp of about 10 volts and 6 volts respectively applied to the control gate and drain of a typical flash memory cell while the source of the memory cell is grounded will cause channel hot electron injection that raises the threshold voltage of the memory cell. Alternatively, the programming voltage Vrp may depend on an analog value being written and range between 8 and 11 volts. Programming voltages Vrp or Vcp when applied to unselected memory cells in the same local row or column as the selected memory cell can cause tunneling which disturbs the threshold voltage of the unselected memory cells. In memory 100, row decoder 120 applies programming voltage Vrp to a single selected global row line 124, and local decoders 140 only apply programming voltage Vrp from the selected global row line 124 to a single local row line 154. Column decoder 110 applies programming voltage Vcp to a single selected global column line 112, and local decoders 130 only apply programming voltage Vcp from the selected global column line 112 to a single local column line 154. Thus, the only unselected memory cells disturbed are in the selected one of arrays A1 to D4.

Figure 2:
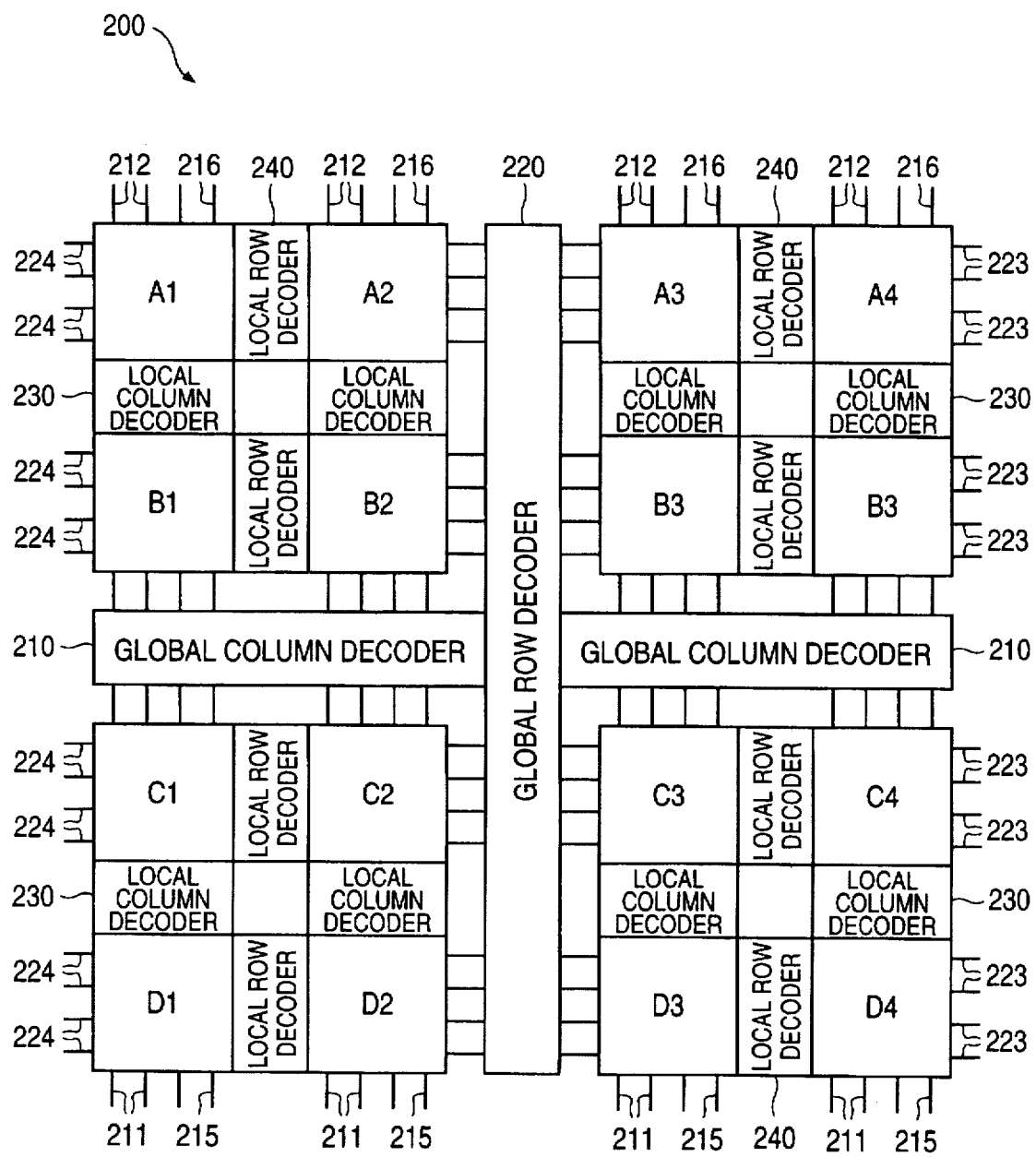
FIG. 2 shows a multiple array architecture in accordance with an embodiment of the invention where global decoders are within an array of memory arrays.

FIG. 2 shows a memory 200 having a global column decoder 210 and a global row decoder 220 between arrays of memory arrays. Global column lines 212 and 211 respectively extend upward and downward from global column decoder 210. As in the memory 100 of FIG. 1, arrays A1 to D4 have column based erase sectors, and global source lines 216 and 215 for the erase sectors respectively extend upward and downward from global column decoder 210. Global row lines 224 and 223 respectively extend left and right of global row decoder 220. Each global column, source, or row line 211, 212, 215, 216, 223, or 224 is continuous and coupled to local column decoders 230 or local row decoders 240. Local column decoders 230 select which row of arrays A1...A4, B1...B4, C1...C4, or D1...D4 are connected to global column lines 211 or 212 or source lines 215 or 216. Local row decoders 140 select which column of arrays A1...D1, A2...D2, A3...D3, or A4...D4 are connected to global row lines 223 or 224.

Figure 3A:
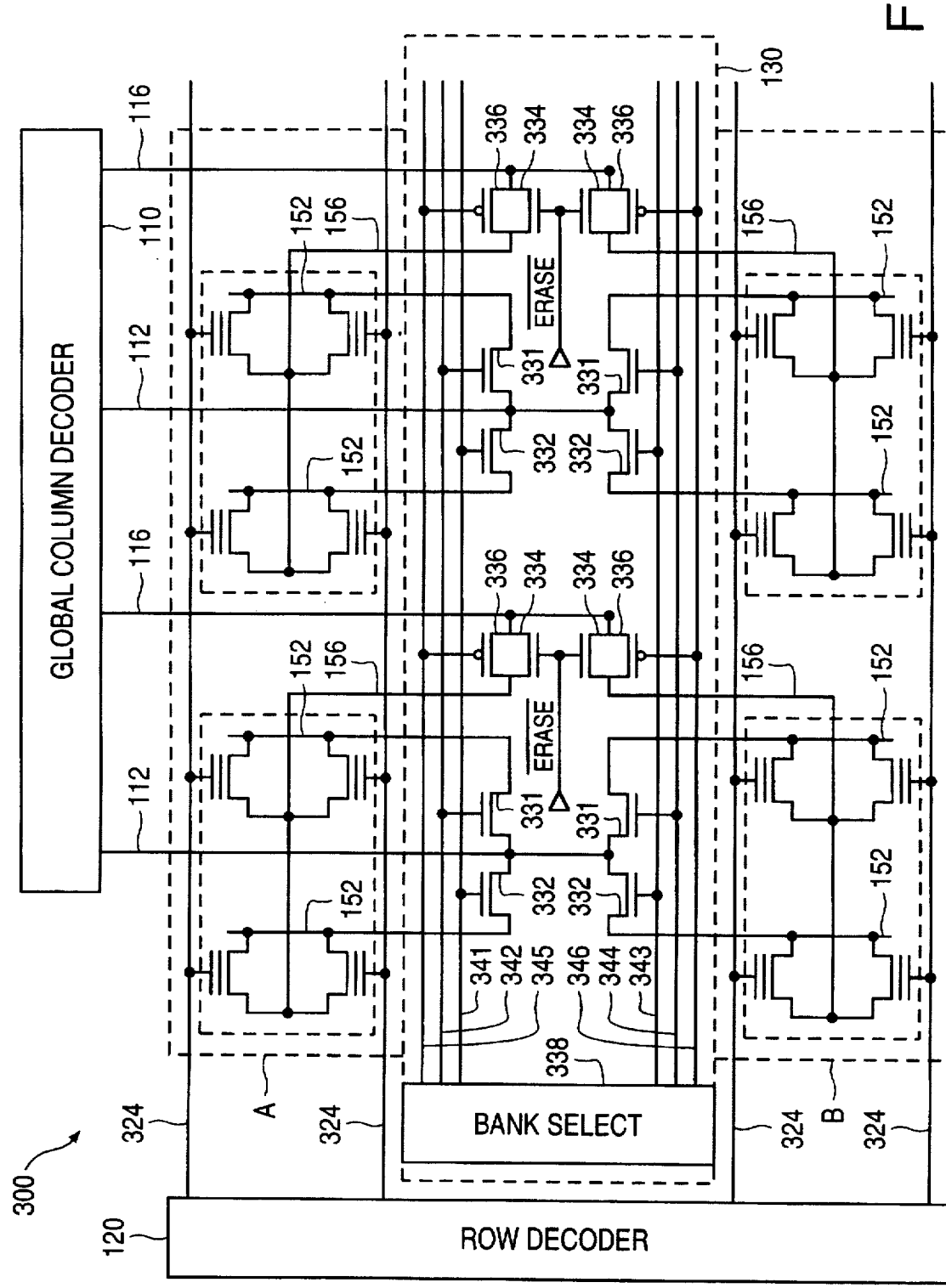
FIG. 3A shows a multiple array architecture and a local decoder for a memory including two arrays in a column.

FIG. 3A shows a memory 300 having two memory arrays A and B arranged in a column. (In memory 300, the number x of column/banks of memory arrays is 1, and the number y of row/banks of memory arrays is 2.) Memory 300 can be expanded to include a single column of more than two memory arrays with additional local decoders between pairs of memory arrays. For ease of illustration, each of memory arrays A and B contains two rows of memory cells connected to row lines 324 and four columns of memory cells coupled to local column lines 152. In an actual memory, each of arrays A and B would contain hundreds of rows and columns of memory cells, the size of each memory array being selected according to the memory cell technology and an acceptable amount of threshold voltage disturb. Since memory 300 only contains one column of memory arrays, row lines 324 are both local row lines for arrays A and B and global row lines for memory 300. This reduces the number of metal layers required when forming memory 300 because row lines 324 are formed from the control gate layer and an overlying metal for global row lines is not required.

Row decoder 120 is a conventional row decoder that decodes a row address to select a row line 324 coupled to a selected memory cell and applies to the selected row line a voltage required for accessing the selected memory cell. Column decoder 110 decodes a column address to select the global column line 112 corresponding to the selected memory cell and applies to the selected column line a voltage required for accessing the selected memory cell. In memory 300, each array A or B includes two local column lines 152 for each global column line 112. Accordingly, a column address identifying the selected memory cell includes a set of bits (for example, the most significant column address bits) that identifies the selected global column line and a set of bits (for example, the least significant column address bits or bit) that identifies one of the local column lines corresponding to the selected global column line. Global column decoder 110 decodes the set of column bits identifying the selected global column line. Local decoder 130 decodes the set of column address bits that select among the local column lines corresponding to each global column line. Local decoder 130 also decodes a set of the row address bits to identify which array A or B contains the selected cell.

Global column decoder 110 also controls the voltages on global source lines 116. In the exemplary embodiment of the invention, all of global source lines 116 are grounded except during an erase. When erasing a selected sector in a select one of arrays A and B, global column decoder 110 applies an erase voltage Vse (typically about 12 volts) to the one of global source lines 116 corresponding to the selected sector and grounds the remaining global source lines 116. Local decoder 130 selects the row of arrays (e.g., array A or array B) containing the sector to be erased and connects local source lines 156 in the select row/bank of arrays to global source lines 116.

Local column decoder 130 includes transistors 331 and 332 coupled between global column lines 112 and corresponding local column lines 152 and transistors 336 coupled between global source lines 116 and corresponding local source lines 156. A bank select circuit 338 decodes address signals to turn on selected ones of transistors 331, 332 and 336. In particular, for a read or write, bank select circuit 338 decodes the most significant bit of the row address of a selected memory cell to determine which array A or B contains the selected memory cell and decodes the least significant bit of the column address to determine whether the selected memory cell is in an even or odd number column of memory 300. Transistors 332 for the selected array A or B are turned on if the column address is even, and transistors 331 for the selected array A or B are turned on if the column address is odd. To turn on the desired ones of transistor 331 and 332, bank select circuit 338 asserts a signal on a line 341 if the selected memory cell is in an even column of array A, asserts a signal on a line 342 if the selected memory cell is in an odd column of array A, asserts a signal on a line 343 if the selected memory cell is in an even column of array B, and asserts a signal on a line 344 if the selected memory cell is in an odd column of array B. In alternative embodiments, more than two local column lines 152 can correspond to the same global column line 112. The number of local columns of memory cells corresponding to a global column line may be selected according to pitch of the memory cells in the arrays and the available area for local decoding circuits between the arrays.

Transistors 336 are off and transistors 334 ground all local source lines 356 of arrays A and B to global source lines 316 except during an erase. During an erase, all of transistors 331, 332, and 334 are off, and bank select circuit 338 asserts a signal on line 345 or 346 to turn on transistors 336 that are coupled to the array A or B containing the sector being erased. The unselected global and local source lines 116 and 156 in array A and B float during an erase.

Figure 3B:
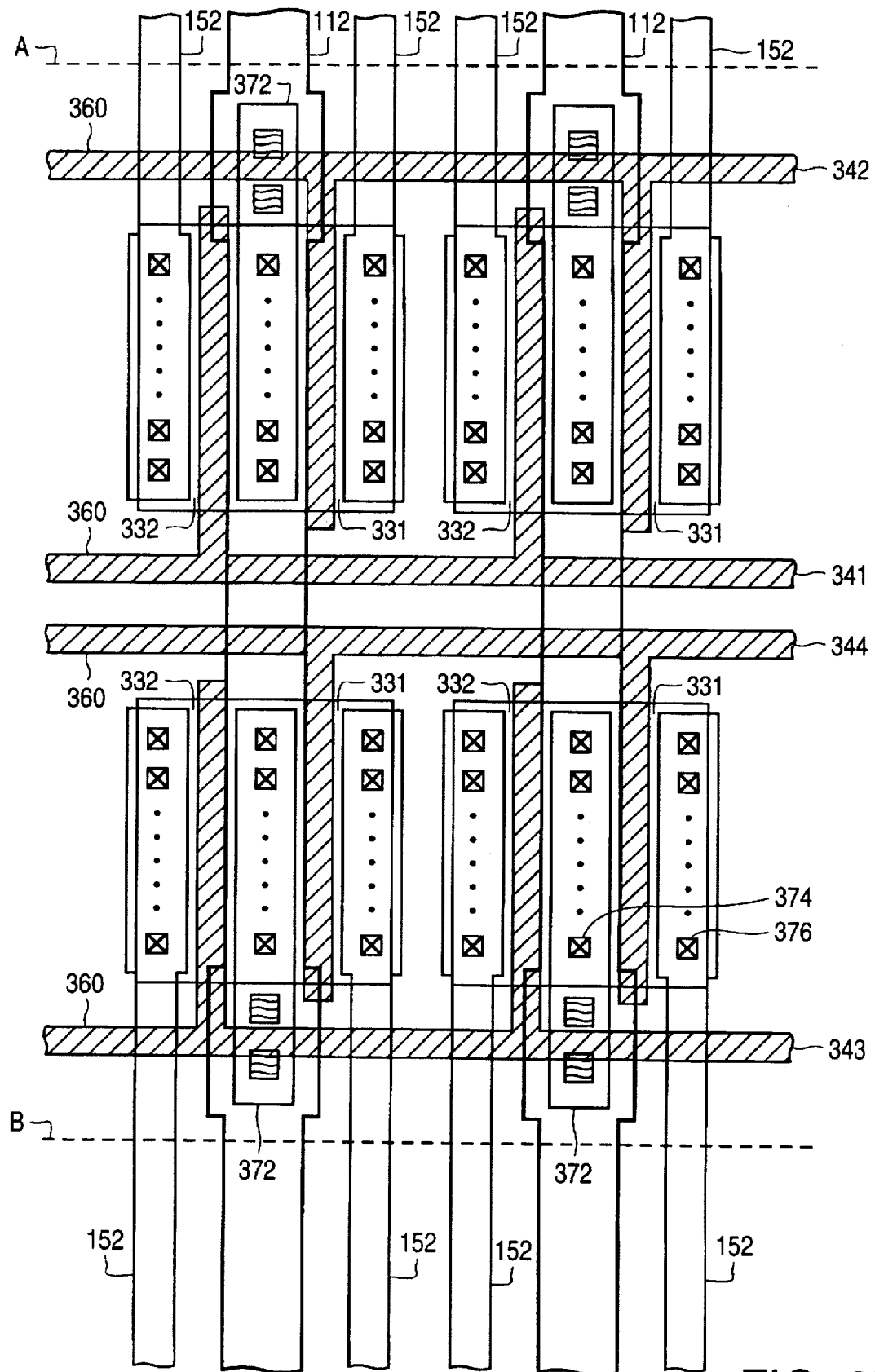
FIG. 3B shows a layout for integrated circuit structures forming a portion of the local decoder in the memory of FIG. 3A.

FIG. 3B shows a layout for regions in an integrated circuit forming a portion of memory 300 and local column decoder 130. In particular, FIG. 3A shows transistors 332 and 331 which connent global column lines 112 to local column lines 152 in arrays A and B. Transistors 331 and 332 have gates formed from portions of a low resistance polysilicon regions 360 which also form lines 341 to 344 connecting transistors 331 and 332 to bank select circuit 338. Polysilicon regions 360 may be formed from a first or second polysilicon layer used for floating or control gates in the memory cells. Source/drain regions for transistors 331 and 332 are formed in a substrate underlying polysilicon regions 360 and connected to overlying metal regions. A first metal layer is patterned to form local column lines 152 and interconnects 312. Contacts 376 connect each local column line 152 to a separate source/drain region of an associated transistor 331 or 332. Contacts 374 connect interconnets 372 to source/drain regions shared by adjacent pairs of transistors 331 and 332, and contacts 382 connect global lines 112, which are formed in a second metal layer, to associated interconnects 372.

Figure 4:
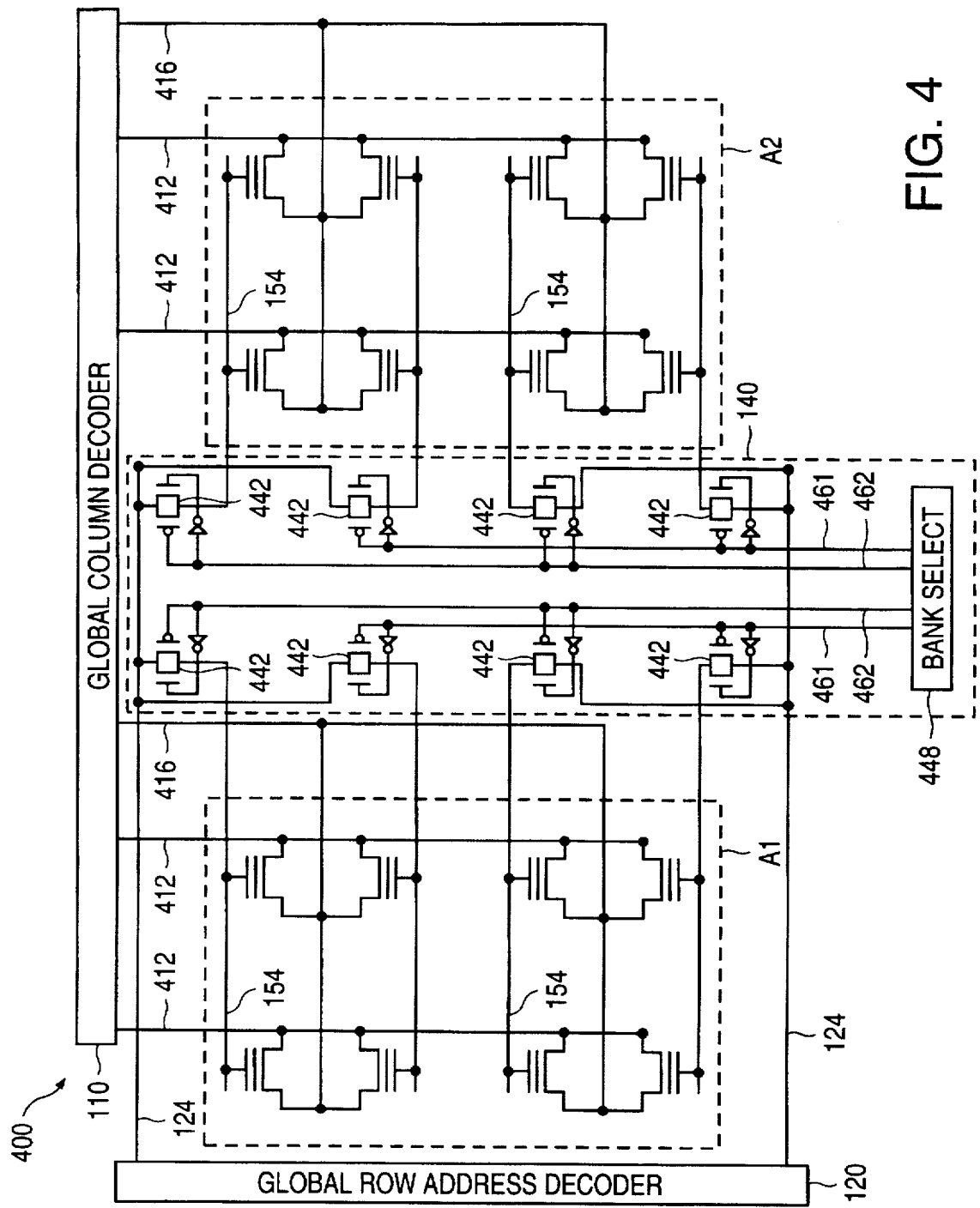
FIG. 4 shows a multiple array architecture and local decoder for a memory including two arrays in a row.

FIG. 4 shows a memory 400 including two arrays A1 and A2 arranged in a row. FIG. 4 shows each of arrays A1 and A2 as having two rows and two columns of memory cells. In an actual memory, each array would typically have hundreds of rows and columns. Each row of memory cells is coupled to a local row line 154, and each column of memory cells is coupled to a column line 412. Column lines 412 act as both local column lines coupled to the drains of memory cells and global column lines coupled to global column decoder 110. Memory 400 includes global column decoder 110 and global row decoder 120 that during a read or write respectively decode column and row address signals to select a respective column line 412 or global row line 124 corresponding to the memory cell identified by the column or row address.

Local decoder 140 is between the two columns of arrays and includes row line selection transistors (or pass gates) 442 and a bank select circuit 448. Each transistor 442 connects a global row line 124 to a corresponding local row line 154. In memory 500, each global row line 124 corresponds to two local row lines 154 in adjacent row. Alternatively, each global row line 124 corresponds to only one local row line 154 in a column of arrays or more than two local row lines. For a particular memory architecture the number of local row lines per global row line is limited by the pitch of the memory arrays and the available area for local decoding circuitry between arrays. Bank selection circuit 448 decodes a set of bits (e.g., the most significant bit) from the column address of a selected memory cell to select the memory array A1 or A2 containing the selected memory cell and a set of bits (e.g., the least significant bit) from the row address of the selected memory cell to determine for each global row line which of the two corresponding local row lines in the selected array is coupled to the global row line. To turn on the desired ones of row line select transistors 442, bank select circuit 448 asserts a signal on a line 461 if the selected memory cell is in an odd row of array A1, asserts a signal on a line 462 if the selected memory cell is in an even row of array A1, asserts a signal on a line 463 if the selected memory cell is in an even row of array A2, and asserts a signal on a line 464 if the selected memory cell is in an odd row of array A2.

Figure 5:
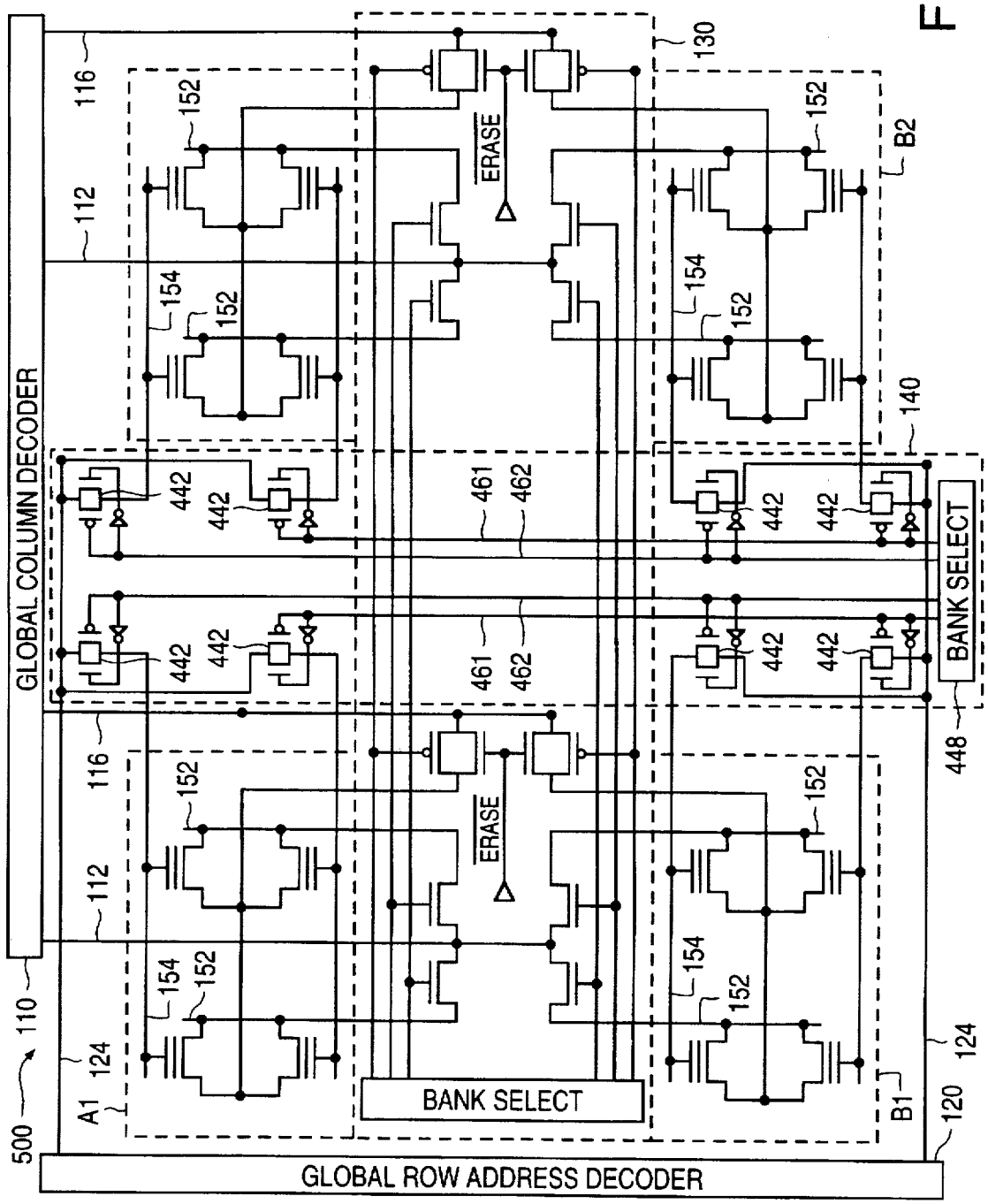
FIG. 5 shows a multiple array architecture and local decode circuitry for a memory including two rows and two columns of memory arrays.

FIG. 5 shows a memory 500 including four arrays A1, A2, B1, and B2 arranged in two rows and two columns. Each of arrays A1 to B2 is illustrated as having two columns of memory cells that are coupled to local column lines 152 and two rows of memory cells that are coupled to local row lines 154. In an actual memory, each array would typically have hundreds of local rows and columns. Memory 500 includes global column decoder 110 and global row decoder 120 that operate as described above. Local column decoder 130, which is between the two rows of arrays, decodes a set of bits of the row address of a selected memory cell to determine which row of arrays array A1, A2 or B1, B2 contains the selected memory cells and connects global column and source lines 112 and 116 to local column and source lines 152 and 156 in the selected row of arrays. Local decoder 130 also decodes the least significant bit of the column address to determine whether the selected memory cell is in an even or odd column of memory 500 and connects the even or odd numbered local column lines to global column lines 112. The circuitry within an embodiment of local decoder 130 is described above in regard to FIG. 3.

Local row decoder 140, which is between the two columns of arrays, decodes a set of bits of the column address of the selected memory cell to determine which column of arrays array A1, B1 or A2,B2 contains the selected memory cells and connects global row lines 124 to local row lines 154 in the selected column of arrays. Local decoder 140 also decodes the least significant bit of the column address to determine whether the selected memory cell is in an even or odd row of memory 500 and connects on the even or odd numbered local row lines 154 to global row lines 124. The circuitry within an embodiment of local decoder 140 is described above in regard to FIG. 4.

Memory 500 can be expanded by adding additionally memory arrays and local decoders, for example, as illustrated in FIGS. 1 and 2.

In above described embodiment, multiple array memory architectures having local decoders that separate global row or column lines from local row or column lines. These architectures reduce threshold voltages disturbances by preventing programming the voltages on the global lines from being applied to the local lines or the memory cell in memory arrays not containing the memory cell being programmed. In an alternative, memory architecture multiple arrays have memory cells directly coupled to continuous global row and column lines so that the row or column programming voltage is applied to unselected cells, but the unselected memory arrays have local source decoders and local source lines that are biased to reduce disturbances that applying the programming voltage to unselected cells causes.

Figure 6:
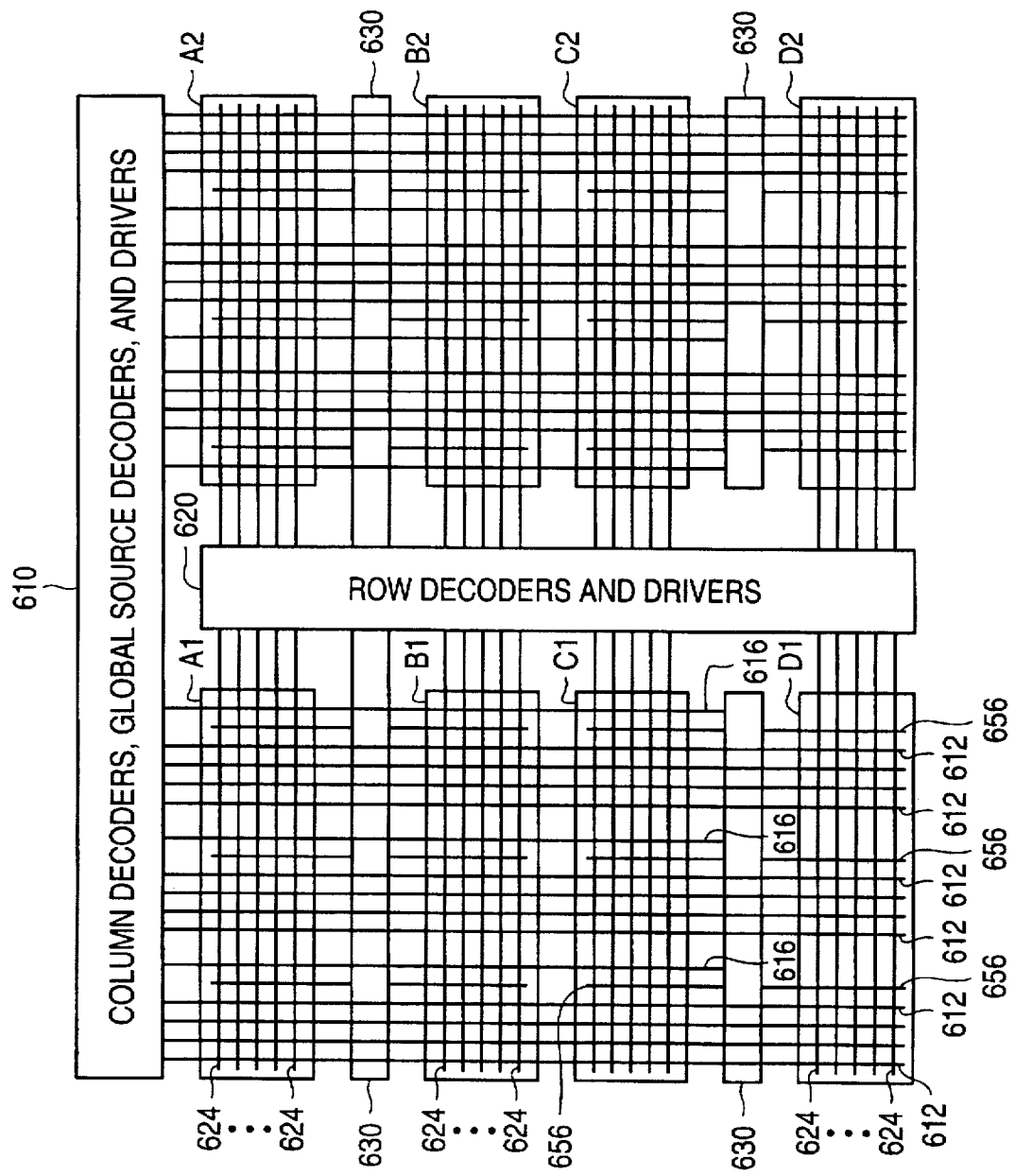
FIG. 6 shows a multiple array architecture in accordance with an embodiment of the invention where source line voltages in unselected sectors are biased to reduce programming disturb.

FIG. 6 illustrates a memory 600 having this alternative memory architecture. Memory 600 includes multiple arrays A1 ... D2, a global column and source decoder 610, a global row decoder 620, and local source decoders 630. Global row decoder 620 is between the two columns of arrays A1 ... D1 and A2 ... D2 and is coupled to continuous row lines 624 that are directly coupled to memory cells. Global column decoder 610 is coupled to continuous column lines 612 and global source lines 616. Each column line 612 directly couples to a column of memory cells (i.e., memory cells from multiple arrays), and each global source line 616 couples to local source decoders 630. Each local source line 656 is coupled to memory cells in a sector of one array and isolated from memory cells in other arrays. In an exemplary embodiment, sectors are row based so that each local source line 656 is electrically coupled to multiple local columns of an array. Alternative memory architectures use row-based sectors.

During programming, drivers associated with global row decoder 620 apply the programming voltage Vrp (between 6 and 12 volts for typical analog or multilevel Flash EPROM) to a row line 624 coupled to the selected cell and ground the other row lines 624 (including all row lines on the side of column decoder 620 opposite the selected cell.) Drivers associated with global column decoder 610 apply programming voltage Vep (about 4 to 6 volts for typical Flash EPROM) to a column line 612 coupled to the selected cell and cause the other column lines 612 to float. Global column decoder 610 also grounds the global source line 656 associated with the associated with the sector containing the selected memory cells, a voltage Vbias (typically about 2 to 4 volts) to the source lines 616 that are on the same side of row decoder 620 as the selected memory cell, and grounds the source lines crossing the column of arrays on the side of row decoder 620 opposite the selected cell. In accordance with an aspect of the invention, local source decoders 630 connect global source lines 616 to the memory array containing the selected cell. For example, local source decoders 630 can decode address bits from the row address of the selected cell to identif the array containing the selected memory cell and then connect the global source lines to the local source lines in that array. Alternatively, row decoder 620 can decode the row address and activate the appropriate local source decoder 630 as required to connect the desired local source lines 656 to the global source lines 616. Accordingly, local source decoders 630 ground the sources of memory cells in the sector containing the select and bias the sources of the memory cells in other sectors of the same array to voltage Vbias. Other local source lines for other memory arrays are allowed to float. For memory cells in the row containing the selected cell, bias voltage Vbias decreases the voltage difference between programming voltage Vrp on the control gate and a voltage on the floating gate. This decreases programming disturb of unselected memory cells caused by electron tunneling between the control gate and the floating gate. Co-owned U.S. patent application Ser. No. 08/781,741, filed Jan. 10, 1997, further describes source biasing voltages and processes and is incorporated by reference herein in its entirety.

An advantage of the architecture of memory 600 is that it can be constructed using a single-metal process. In particular, local source lines 656 may be formed entirely as diffused regions of a substrate or as diffused regions which are strapped together by a line formed in an overlying conductive layer such as a first polysilicon layer, a second polysilicon layer, or a first metal layer. Continuous row lines 624 are formed in the second polysilicon or silicide layer which overlies the floating gates formed in the first polysilicon layer. Global row lines 612, global source lines 616, and (if necessary) parts of local source lines 656 are formed from the metal later. Single metal processes are well-known and conventional for non-volatile semiconductor memory. Memory made from a single metal process tend to be less complex and less expensive than memory made with a double or triple metal process.

Although the invention has been described with reference to particular embodiments, the description is only an example of the invention's application and should not be taken as a limitation. Various adaptations and combinations of features of the embodiments disclosed are within the scope of the invention as defined by the following claims.

We claim:

1. A method for programming a selected memory cell in a non-volatile semiconductor memory during an access of the selected memory cell, the method comprising:

providing in the memory a plurality of memory arrays arranged in multiple rows and multiple columns of the memory arrays, global column lines crossing the memory arrays, and global row lines crossing the memory arrays, each memory array has local column lines and local row lines coupled to memory cells in the memory array, the local column and row lines electrically isolated from each other;

decoding a column address signal to select from the global column lines a global column line that corresponds to the selected memory cell;

decoding a row address signal to select from the global row lines a global row line that corresponds to the selected memory cell;

applying a first voltage to the selected global column line during the access;

applying a second voltage to the selected global row line during the access;

decoding the row address signal to select a row of memory arrays from the plurality of memory arrays, the selected row including an array that contains the selected memory cell;

connecting the global column lines to the local column lines in the selected row of memory arrays during the access of the selected memory cell so that the first voltage is applied through the selected global column line to the selected memory cell, and disconnecting the plurality of global column lines from memory arrays that are not in the selected row;

decoding the column address signal to select a column of memory arrays from the plurality of memory arrays, the selected column including the array that contains the selected memory cell; and connecting the global row lines to the local row lines in the selected column of memory arrays during the access of the selected memory cell so that the second voltage is applied through the selected global row line to the selected memory cell, and disconnecting the plurality of global row lines from memory arrays that are not in the selected column.

2. The method of claim 1, wherein connecting the global column lines further comprises decoding the column address signal to select which local column lines in the selected row of memory arrays are connected to the global column lines.

3. The method of claim 1, wherein connecting the global row lines further comprises decoding the row address signal to select which local row lines in the selected column of memory arrays are connected to the global row lines.

4. A memory comprising:

a plurality of memory arrays arranged in multiple columns and multiple rows, each memory array including a plurality of memory cells, each memory array including local lines coupled to each of the memory cells in the array and electrically isolated from the memory cells in the other memory arrays;

continuous global lines crossing the plurality of memory arrays;

global decoding circuitry coupled to the global lines for decoding an address signal identifying a memory cell in one of the plurality of memory arrays and applying operating voltages to one or more of the global lines that correspond to the memory cell;

local decoding circuitry coupled between the global lines and the local lines, for selecting a bank of the memory arrays and connecting the global lines to the local lines only in the bank of memory arrays selected;

said local lines including local column lines and local row lines, each local column line coupled to drains of memory cells in a column in one of the plurality of memory arrays, each local row line coupled to control gates of memory cells in a row in one of the plurality of memory arrays;

said global lines including global column lines and global row lines;

said global decoding circuitry including a global column decoding and a global row decoder, and for accessing a target memory cell, the global column decoder decoding a column address signal for the target memory cell and applying a first voltage to a global column line corresponding to the target memory cell and the global row decoder decoding a row address signal for the target memory cell and applying a second voltage to a global row line corresponding to the target memory cell; and said local decoding circuitry including:
  a first local decoder that decodes the row address signal to select a row of the memory arrays and connects the global column lines to the local column lines in the selected row of the memory arrays; and
  a second local decoder that decodes the column address signal to select a column of the memory arrays and connects the global row lines to the local row lines in the selected column of the memory arrays.

5. The memory of claim 4, wherein the first local decoder further decodes the column address signal to select which local column lines in the selected row of the memory arrays are coupled to the global column lines.

6. The memory of claim 5, wherein the second local decoder further decodes the row address signal to select which local row lines in the selected column of the memory arrays are coupled to the global row lines.

7. The memory of claim 4, wherein the second local decoder further decodes the row address signal to select which local row lines in the selected column of the memory arrays are coupled to the global row lines.

8. The memory of claim 4, wherein:
  the local lines include local source lines, each local source line being coupled to sources of memory cells in a column in one of the plurality of memory arrays;
  the global lines include continuous global source lines that extend across the memory arrays in the column of memory arrays; and
  the local decoding circuitry includes local source decoders that identify which one of the plurality of memory arrays contains a memory cell selected for access and connect the global source lines to the local source lines in the memory array identified.

9. The memory of claim 8, wherein the global decoding circuitry includes a global source decoder that decodes a column address to identify a global source line associated with the memory cell selected for access, applies a programming voltage to the global source line identified, and applies a bias voltage to other global source lines.

10. A method for reducing disturbance of threshold voltages of unselected memory cells during an access of a selected memory cell in a memory, the method comprising:
  providing in the memory a plurality of global lines and a plurality of memory arrays arranged in multiple columns and multiple rows, each memory array including a plurality of memory cells and including local lines coupled to each of the memory cells in the array, the local lines being electrically isolated from each other;
  decoding an address signal to select from the plurality of global lines a global line corresponding to the selected memory cell;
  applying a voltage to the selected global line during the access;
  decoding the address signal to select from the plurality of memory arrays a bank of memory arrays including an array that contains the selected memory cell; and
  connecting the plurality of global lines to the local lines in the bank of memory arrays during the access of the selected memory cell so that the voltage on the selected global line is applied to the selected memory cell, and disconnecting the plurality of global lines from memory arrays in the plurality of memory arrays that are not in the selected bank.

11. The method of claim 10, wherein:
  applying the voltage includes applying the voltage to a continuous global column line; and
  the selected bank of memory arrays is a memory array containing the selected memory cell.

12. The method of claim 10 wherein:
  applying the voltage comprise applying the voltage to a continuous global row line; and
  the selected bank of memory arrays is a memory array containing the selected memory cell.

13. The method of claim 10, wherein
  the selected bank of memory arrays is a memory array containing the selected memory cell.

14. The method of claim 10, wherein the access writes a value to the selected memory cell.

15. The method of claim 10, wherein:
  the plurality of global lines includes a plurality of global source lines;
  applying the voltage comprises applying the voltage to a global source line that is associated with a sector containing the selected memory cell; and
  the selected bank of memory arrays is a memory array containing the selected memory cell.

16. The method of claim 15, further comprising:
  applying a programming voltage to a row line coupled to the selected memory cell; and
  applying a bias voltage to global source lines associated with sectors not containing the selected memory cell.

17. A memory comprising:
  a plurality of memory arrays each including a plurality of memory cells, each memory array including local lines coupled to each of the memory cells in the array and electrically isolated from the memory cells in the other memory arrays;
  continuous global lines crossing the plurality of memory arrays;
  global decoding circuitry coupled to the global lines, for decoding an address signal identifying a memory cell in one of the plurality of memory arrays and applying operating voltages to one or more of the global lines that correspond to the memory cell; and
  local decoding circuitry coupled between the global lines and the local lines, for selecting a bank of the memory arrays and connecting the global lines to the local lines only in the bank of memory arrays selected; wherein
  the plurality of memory arrays include at least one of a column or row of memory arrays;
  the local lines include local source lines, each local source line being coupled to sources of memory cells in a column or row in one of the plurality of memory arrays;

the global lines include continuous global source lines that extend across the memory arrays in the column or row of memory arrays; and the local decoding circuitry includes local source decoders that identify which one of the plurality of memory arrays contains a memory cell selected for access and connect the global source lines to the local source lines in the memory array identified.

18. The memory of claim 17, wherein:

the plurality of memory arrays includes a column of memory arrays;

the local lines include local column lines with each local column line being coupled to a column of memory cells in one of the plurality of memory array;

the global lines include continuous global column lines; and the local decoding circuitry decodes a row address signal of a target memory cell to select a memory array in the column of memory arrays and connects the global column lines to the local column lines in the selected memory array.

19. The memory of claim 18, herein the local decoding circuitry further decodes a column address signal of the target memory cell to select which local column lines in the selected memory array are connected to the global column lines.

20. The memory of claim 17, wherein:

the plurality of memory arrays includes a row of memory arrays;

the local lines include local row lines with each local row line being coupled to a row of memory cells in one of the plurality of memory array;

the global lines include continuous global row lines; and the local decoding circuitry decodes a column address signal of a target memory cell to select a memory array in the row of memory arrays and connects the global row lines to the local row lines in the selected memory array.

21. The memory of claim 20, wherein the local decoding circuitry further decodes a row address signal of the target memory cell to select which local row lines in the selected memory array are connected to the global row lines.

22. The memory of claim 17, wherein:

said plurality of memory arrays are arranged in multiple columns and multiple rows;

said local lines include local column lines and local row lines, each local column line coupled to drains of memory cells in a column in one of the plurality of memory arrays, each local row line coupled to control gates of memory cells in a row in one of the plurality of memory arrays;

said global lines include global column lines and global row lines;

said global decoding circuitry includes a global column decoder and a global row decoder, and for accessing a target memory cell, the global column decoder decodes a column address signal for the target memory cell and applies a first voltage to a global column line corresponding to the target memory cell and the global row decoder decodes a row address signal for the target memory cell and applies a second voltage to a global row line corresponding to the target memory cell; and said local decoding circuitry includes:

a first local decoder that decodes the row address signal to select a row of the memory arrays and connects the global column lines to the local column lines in the selected row of the memory arrays; and a second local decoder that decodes the column address signal to select a column of the memory arrays and connects the global row lines to the local row lines in the selected column of the memory arrays.

23. The memory of claim 22, wherein the first column decoder farther decodes the column address signal to select which local column lines in the selected row of the memory arrays are coupled to the global column lines.

24. The memory of claim 23, wherein the second local decoder further decodes the row address signal to select which local row lines in the selected column of the memory arrays are coupled to the global row lines.

25. The memory of claim 22, wherein the second local decoder further decodes the row address signal to select which local row lines in the selected column of the memory arrays are coupled to the global row lines.

26. The memory of claim 17, wherein the global decoding circuitry includes a global source decoder that decodes a column address to identify a global source line associated with the memory cell selected for access, applies a programming voltage to the global source line identified, and applies a bias voltage to other global source lines.

* * * * *